United States Patent
Matsumoto

(10) Patent No.: US 7,369,006 B2
(45) Date of Patent: May 6, 2008

(54) APPLIED VOLTAGE CONTROL CIRCUIT FOR VOLTAGE CONTROLLED OSCILLATION CIRCUIT

(75) Inventor: Kenichi Matsumoto, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 87 days.

(21) Appl. No.: 11/397,564

(22) Filed: Apr. 5, 2006

(65) Prior Publication Data

US 2006/0226919 A1  Oct. 12, 2006

(30) Foreign Application Priority Data

Apr. 7, 2005  (JP)  ............... 2005-110577

(51) Int. Cl.
*H03B 5/32* (2006.01)
(52) U.S. Cl. ............. 331/160; 331/116 R; 331/158; 331/177 V
(58) Field of Classification Search ............. 331/36 C, 331/116 R, 116 FE, 158, 160, 177 R, 177 V
See application file for complete search history.

(56) References Cited

U.S. PATENT DOCUMENTS 4,956,618 A  9/1990  Ulmer
6,791,421 B2  9/2004  Oita
7,009,460 B2*  3/2006  Wilcox .................. 331/173
2002/0171500 A1* 11/2002  Hasegawa et al. ........ 331/179

FOREIGN PATENT DOCUMENTS

JP  2002-237722  8/2002

* cited by examiner

*Primary Examiner*—Benny Lee
*Assistant Examiner*—Ryan J Johnson
(74) *Attorney, Agent, or Firm*—McDermott Will & Emery LLP

(57) ABSTRACT

When a power supply is turned on, an NPN transistor is disconnected, a first transmission gate is conducted, a second transmission gate is disconnected, and a power-supply voltage is applied to a control input terminal of a voltage controlled oscillation circuit via the first transmission gate. After oscillation of a quartz resonator is stabilized, the NPN transistor is switched to the conducted state by a control signal applied to a general purpose terminal so that the first transmission gate is switched to the disconnected state, and the second transmission gate is switched to the conducted state. Then, a voltage of the voltage control terminal is applied to the control input terminal of the voltage controlled oscillation circuit via the second transmission gate.

9 Claims, 11 Drawing Sheets

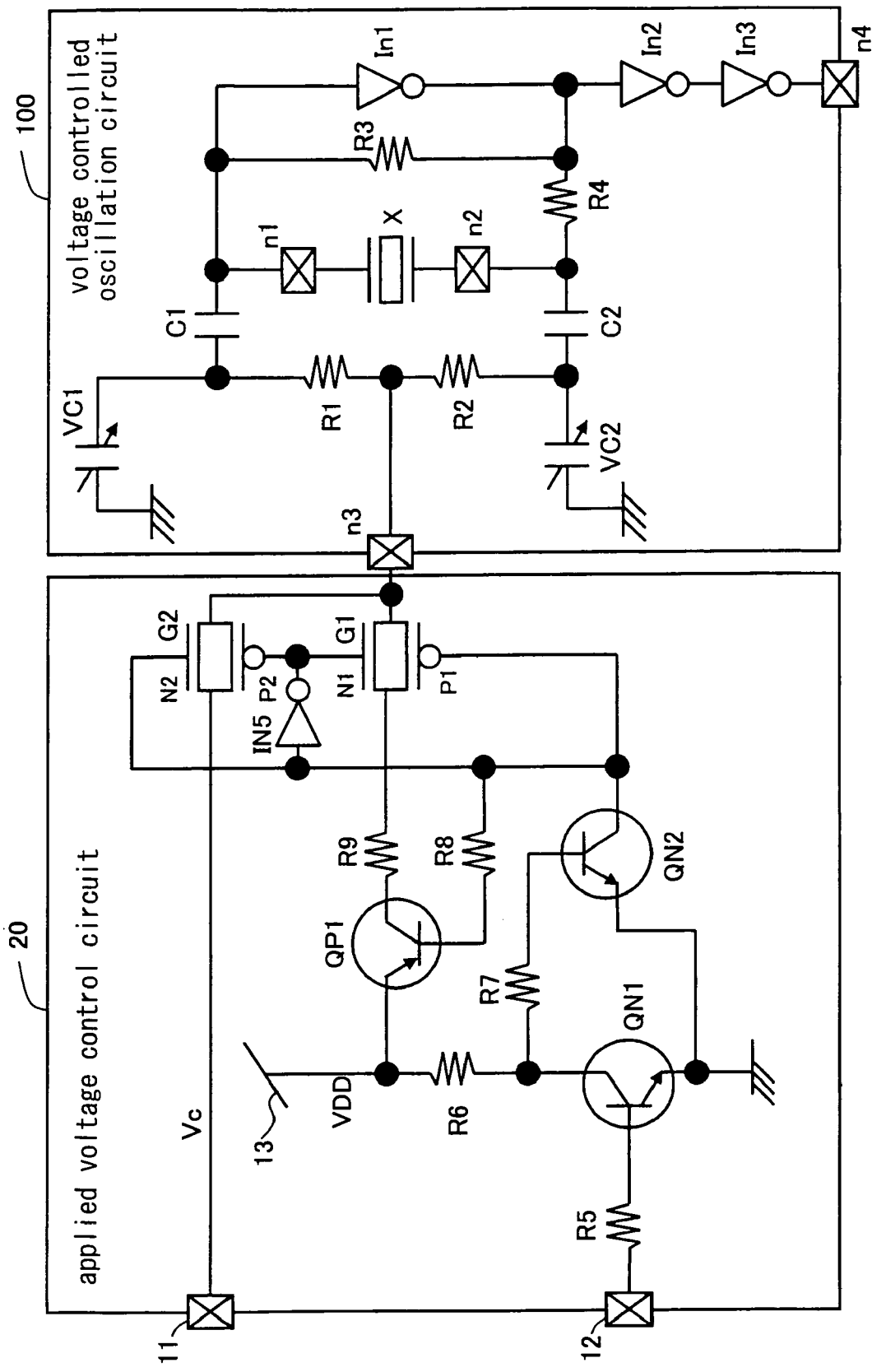
F I G. 2

FIG. 7A capacitor C3

FIG. 7B quartz resonator X

APPLIED VOLTAGE CONTROL CIRCUIT FOR VOLTAGE CONTROLLED OSCILLATION CIRCUIT

FIELD OF THE INVENTION

The present invention relates to an applied voltage control circuit for a voltage controlled oscillation circuit (VCO), and is effectively applied to an applied voltage control circuit for a voltage controlled oscillation circuit which can be controlled by an external microcomputer, LSI or the like. Further, the present invention can also be applied to circuits in general for switching to and from a voltage while a power supply is turned and a voltage after the power supply is turned on.

BACKGROUND OF THE INVENTION

A conventional voltage controlled oscillation circuit 100 shown in FIG. 10 comprises a quartz resonator X connected to between two terminals n1 and n2, a capacitor C1 and a varicap (voltage variable capacitance diode) VC1 serially connected to between the terminal n1 and ground GND, a capacitor C2 and a varicap VC2 serially connected to between the terminal n2 and the ground GND, resistance elements R1 and R2 serially connected to between a connection point of the capacitor C1 and the varicap VC1 and a connection point of the capacitor C2 and the varicap VC2, and a control input terminal n3 connected to a connection point of the resistance elements R1 and R2. A voltage level Vc of a control signal is applied to the control input terminals n3. Further provided are resistance elements R3 and R4 serially connected to between the terminals n1 and n2, an inverter In1 whose input side is connected to the terminal n1 and output side is connected to a connection point of the resistance elements R3 and R4, inverters In2 and In3 serially connected to the output side of the inverter In1, and an output terminal n4 connected to an output side of the inverter In3.

When power is supplied to the voltage controlled oscillation circuit 100, the voltage level Vc of the control signal is applied to the control input terminal n3. The voltage level Vc is applied to the varicaps VC1 and VC2 via the resistance elements R1 and R2. Then, capacitance values of the varicaps VC1 and VC2 change in response to the voltage level Vc, and an oscillation frequency due to resonance specific to the quartz resonator X accordingly changes within a predetermined range. Thus, a signal of the oscillation frequency in response to the voltage level Vc of the control signal is outputted from the inverter In1 to be waveform-shaped and amplified via the inverters In2 and In3 and then it is outputted outside from the output terminal n4.

In the voltage controlled oscillation circuit 100, when the voltage level Vc of the control signal applied to the control input terminal n3 is relatively small, the capacitance values of the varicaps VC1 and VC2 are relatively large. As a result, a long time is required to start the oscillation.

In contrast to the foregoing constitution, a method was proposed, wherein a start voltage is given to be able to stabilize the oscillation better than the voltage level of the control signal in the normal oscillation at supplying the power, and the voltage is switched to normal control through a voltage control terminal after the oscillation is stabilized, (for example, see No. 2002-237722 of the Publication of the Unexamined Japanese Patent Applications (see Page 2-3 and FIG. 1)).

Describing the foregoing constitution, an applied voltage control circuit 70 for the voltage controlled oscillation circuit is constructed as shown in FIG. 11. When the power supply is turned on, an oscillation start-up recognizing circuit 71 outputs "L" level as a control signal ST until the oscillation of the voltage controlled oscillation circuit 100 is detected. At the time, an NMOS transistor and a PMOS transistor of a transmission gate G3 are in a disconnected state, and the transmission gate G3 is also in the disconnected state. Because the control signal ST is at the "L" level, a PMOS transistor P4 is conducted, and a power-supply voltage VDD is applied to the control input terminal n3 of the voltage controlled oscillation circuit 100. Since the power-supply voltage VDD is sufficiently higher than the voltage level Vc of the control signal, the time required for starting the oscillation of the quartz resonator X is reduced. Then, the oscillation start-up recognizing circuit 71 detects that the oscillation of the voltage controlled oscillation circuit 100 has been stabilized, and inverts the control signal ST to "H" level. As a result, the PMOS transistor P4 is disconnected, and the transmission gate G3 is now conducted. Then, the voltage level Vc of the control signal from the voltage control terminal 72 is applied to the control input terminal n3 via the transmission gate G3. Thus, the control operation shifts to the conventional control state.

As an integration of LSI becomes higher reductions of power consumption of the LSI itself and an internal power-supply voltage are done, and it is predicted that a level of a power-supply voltage for a digital terminal is also reduced. As a first problem, there causes a possibility that "H" level of a general purpose port, which can be controlled by the LSI or external microcomputer, may not satisfy a minimum allowable value to recognize the "H" level of the transmission gate. As a result, the transmission gate cannot be conducted after the oscillation is stabilized, which makes the control through the voltage control terminal impossible.

As a second problem, when gates of the PMOS transistor and the transmission gate are switched immediately after the power supply is turned on and after the oscillation is stabilized, a period when the PMOS transistor and the transmission gate are simultaneously conducted is generated due to influences such as a delay of the inverter resulting from the inversion of the signal. As a result, the power-supply voltage is applied to the voltage control terminal, which is likely to cause an overload to a control port of the LSI or external microcomputer.

SUMMARY OF THE INVENTION

A main object of the present invention is as follows. It is able to supply a power-supply voltage higher than a voltage level of a control signal applied to a general purpose port, which can be controlled by an external microcomputer or LSI, based on an amplifying operation of a transistor at starting a power supply even though the voltage level of the control signal does not satisfy a minimum allowable value to recognize "H" level of a transmission gate. As a result, a length of time required for stabilizing oscillation of a quartz resonator in a voltage controlled oscillation circuit is reduced, and a polarity of the general purpose port externally controlled is reversed after the oscillation is stabilized, so that the voltage switched to the control through a voltage control terminal to keep the stabilized oscillation continuously.

An applied voltage control circuit for a voltage controlled oscillation circuit according to the present invention comprises:

a first transmission gate inserted between a control input terminal of the voltage controlled oscillation circuit and a power-supply terminal;

a second transmission gate inserted between the control input terminal of the voltage controlled oscillation circuit and a voltage control terminal; and an NPN transistor for switching an applied voltage inserted between a connection point of the power-supply terminal and the first transmission gate and a ground terminal and controlled by a control signal applied to a general purpose terminal externally controlled, wherein a collector of the NPN transistor is connected to a gate of an NMOS transistor of the first transmission gate and a gate of a PMOS transistor of the second transmission gate, and further connected to a gate of a PMOS transistor of the first transmission gate and a gate of an NMOS transistor of the second transmission gate via an inverter, the NPN transistor is disconnected when a power supply is turned on so that the first transmission gate is conducted and the second transmission gate is disconnected, and a power-supply voltage of the power-supply terminal is applied to the control input terminal of the voltage controlled oscillation circuit via the first transmission gate in the conducted state, and the NPN transistor is switched to the conducted state by the control signal applied to the general purpose terminal after oscillation of the voltage controlled oscillation circuit is stabilized so that the first transmission gate is switched to the disconnected state and the second transmission gate is switched to the conducted state, and a voltage of the voltage control terminal is applied to the control input terminal of the voltage controlled oscillation circuit via the second transmission gate in the conducted state.

According to the foregoing configuration, even when the voltage level of the control signal applied to the general purpose terminal when the power supply is turned on does not satisfy the minimum allowance level for recognizing the "H" level of the transmission gate, the amplifying operation of the NPN transistor is utilized so that the voltage of the NPN transistor on the collector side is increased to reach such a voltage level that recognizes the "H" level at the transmission gates, which allows the transmission gates to be switched. Then, the first transmission gate is conducted when the power supply is turned on so that the power-supply voltage higher than the voltage level of the control signal is supplied. Thereby, the length of time required for the oscillation of the quartz resonator in the voltage controlled oscillation circuit to be stabilized is reduced, and the polarity of the general purpose terminal externally controlled is inverted after the oscillation is stabilized. As a result, the control operation shifts to the control through the voltage control terminal, and the stabilized oscillation can be continuously obtained.

An applied voltage control circuit for a voltage controlled oscillation circuit according to the present invention comprises:

a first transmission gate whose one end is connected to a control input terminal of the voltage controlled oscillation circuit;

a PNP transistor inserted between another end of the first transmission gate and a power-supply terminal;

a second transmission gate inserted between the control input terminal of the voltage controlled oscillation circuit and a voltage control terminal;

a first NPN transistor inserted between a ground terminal and a connection point of the power-supply terminal and the PNP transistor and controlled by a control signal applied to a general purpose terminal externally controlled, and a second NPN transistor whose base is connected to a collector of the first NPN transistor, collector is connected to abase of the PNP transistor, and emitter is grounded, wherein the collector of the second NPN transistor is connected to a gate of a PMOS transistor of the first transmission gate and a gate of an NMOS transistor of the second transmission gate, and further connected to a gate of an NMOS transistor of the first transmission gate and a gate of a PMOS transistor of the second transmission gate via an inverter, the first NPN transistor is disconnected, the second NPN transistor is conducted, and the PNP transistor is conducted when a power supply is turned on so that the first transmission gate is conducted and the second transmission gate is disconnected, and a power-supply voltage of the power-supply terminal is applied to the control input terminal of the voltage controlled oscillation circuit via the PNP transistor and the first transmission gate in the conducted state, and the first NPN transistor is switched to the conducted state by the control signal applied to the general purpose terminal after oscillation of the voltage controlled oscillation circuit is stabilized so that the first transmission gate is switched to the disconnected state and the second transmission gate is switched to the conducted state, and a voltage of the voltage control terminal is applied to the control input terminal of the voltage controlled oscillation circuit via the second transmission gate in the conducted state.

According to the foregoing configuration, even when the voltage level of the control signal applied to the general purpose terminal when the power supply is turned on does not satisfy the minimum allowance level for recognizing the "H" level of the transmission gate, the amplifying operations of the first and second NPN transistors are utilized so that the voltage of the second NPN transistor on the collector side is increased to reach such a voltage level that recognizes the "H" level at the transmission gates, which allows the transmission gates to be switched. Then, the first transmission gate is conducted when the power supply is turned on so that the power-supply voltage higher than the voltage level of the control signal is supplied. Thereby, the length of time required for the oscillation of the quartz resonator in the voltage controlled oscillation circuit to be stabilized is reduced, and the polarity of the general purpose terminal externally controlled is inverted after the oscillation is stabilized. As a result, the control operation shifts to the control through the voltage control terminal, and the stabilized oscillation can be continuously obtained. Further, because the first and second NMOS transistors and the PNP transistor are provided, there is a sufficient amount of time for the first transmission gate to be conducted with respect to a timing of starting the oscillation of the quartz resonator, and the power-supply voltage higher than the voltage level of the control signal can be applied. As a result, the oscillation can be further stabilized.

An applied voltage control circuit for a voltage controlled oscillation circuit according to the present invention comprises:
- a first transmission gate inserted between a control input terminal of the voltage controlled oscillation circuit and a power-supply terminal;
- a second transmission gate inserted between the control input terminal of the voltage controlled oscillation circuit and a voltage control terminal; and
- a pull-up resistance connected to a connection line of a general purpose terminal externally controlled and the control input terminal of the voltage controlled oscillation circuit, wherein
- the general purpose terminal externally controlled is connected to a gate of a PMOS transistor of the first transmission gate and a gate of an NMOS transistor of the second transmission gate, and further connected to a gate of an NMOS transistor of the first transmission gate and a gate of a PMOS transistor of the second transmission gate via an inverter,
- "L" level is applied to the general purpose terminal when a power supply is turned on so that the first transmission gate is conducted and the second transmission gate is disconnected, and a power-supply voltage of the power-supply terminal is applied to the control input terminal of the voltage controlled oscillation circuit via the first transmission gate in the conducted state, and
  - the control signal applied to the general purpose terminal is switched after oscillation of the voltage controlled oscillation circuit is stabilized so that the first transmission gate is switched to the disconnected state and the second transmission gate is switched to the conducted state, and a voltage of the voltage control terminal is applied to the control input terminal of the voltage controlled oscillation circuit via the second transmission gate in the conducted state.

According to the foregoing configuration, when the state where the first transmission gate is conducted is switched to the state where the second transmission gate is conducted, the first and second transmission gates are simultaneously conducted due to a delay time in the inverter, an internal wiring delay or the like, and the power-supply voltage may be applied to a control port of the LSI or external microcomputer via the both transmission gates. Therefore, the pull-up resistance is additionally provided as described so that a period of the transition from the "H" level to the "L" level is extended to be longer than the delay time so that a period when the transmission gates are simultaneously conducted is not generated. Thereby, the control port of the LSI or external microcomputer can be prevented from any overload applied thereto.

An applied voltage control circuit for a voltage controlled oscillation circuit according to the present invention comprises:
- a general purpose terminal externally controlled and connected to a control input terminal of the voltage controlled oscillation circuit; and
- a series circuit comprising a capacitor for charge and discharge and a resistance and inserted between a power-supply voltage terminal to which a power-supply voltage is applied and a connection line of the general purpose terminal and the control input terminal of the voltage controlled oscillation circuit.

According to the foregoing configuration, the capacitor starts to be charged immediately after the power supply is turned on so that the voltage is increased to such a level that satisfies an oscillation margin of the quartz resonator in the voltage controlled oscillation circuit. Thereby, the oscillation of the quartz resonator can be surely stabilized by utilizing the voltage which is increased until the capacitor is discharged.

An applied voltage control circuit for a voltage controlled oscillation circuit according to the present invention comprises:
- a general purpose terminal externally controlled and connected to a control input terminal of the voltage controlled oscillation circuit;
- a series circuit comprising a capacitor for charge and discharge, a resistance and a switching element and inserted between a power-supply voltage terminal to which a power-supply voltage is applied and a connection line of the general purpose terminal and the control input terminal of the voltage controlled oscillation circuit; and
- an edge detecting circuit for detecting an edge of an oscillation clock in the voltage controlled oscillation circuit and controlling the switching element based on a detection signal thereby obtained.

According to the foregoing configuration, a rising edge or a falling edge of the oscillation clock is detected immediately after the oscillation of the quartz resonator in the voltage controlled oscillation circuit starts, and the switching element is disconnected, in response to which the discharge of the capacitor is initiated. As a result, the control operation shifts to the control through the voltage control terminal.

The foregoing applied voltage control circuit for the voltage controlled oscillation circuit may be configured in such a manner that the conductivity type of the respective transistors is reversed, and the logic of the voltage for the control operation is reversed.

An applied voltage control circuit for a voltage controlled oscillation circuit according to the present invention is an applied voltage control circuit for controlling start-up of oscillation of the voltage controlled oscillation circuit, comprising:
- a voltage control terminal to which a voltage is applied from outside;
- a power-supply voltage terminal to which a power-supply voltage used for controlling the voltage controlled oscillation circuit is supplied during a certain period after the start-up of the voltage controlled oscillation circuit;
- a first transmission gate for transmitting the power-supply voltage supplied via the power-supply voltage terminal to the voltage controlled oscillation circuit in order to control the voltage controlled oscillation circuit; and
- a second transmission gate for transmitting the voltage applied from the voltage control terminal to the voltage controlled oscillation circuit in order to control the voltage controlled oscillation circuit, wherein
- the first transmission gate is conducted by the power-supply voltage supplied via the power-supply voltage terminal during a certain period after the start-up of the voltage controlled oscillation circuit so that the power-supply voltage supplied via the power-supply voltage terminal is transmitted to the voltage controlled oscillation circuit in order to control the voltage controlled oscillation circuit, and
- the second transmission gate is conducted by the power-supply voltage supplied via the power-supply voltage terminal during a certain period after the start-up of the voltage controlled oscillation circuit so that the voltage supplied from the voltage control terminal is transmitted to the voltage controlled oscillation circuit in order to control the voltage controlled oscillation circuit.

In the foregoing constitution, the power-supply voltage supplied from the power-supply voltage terminal is higher than the voltage applied from the voltage control terminal.

The applied voltage control circuit for the voltage controlled oscillation circuit according to the present invention further comprises a general purpose terminal to which a signal indicating that a certain period has passed since the start-up of the voltage controlled oscillation circuit is inputted, wherein
the first and second transmission gates are controlled in accordance with the signal inputted from the general purpose terminal.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art upon the implementation of the present invention.

FIG. 2 is a circuit diagram illustrating configurations of an applied voltage control circuit for a voltage controlled oscillation circuit and the voltage controlled oscillation circuit according to a second preferred embodiment of the present invention.

DETAILED DESCRIPTION OF THE INVENTION

Figure 1:
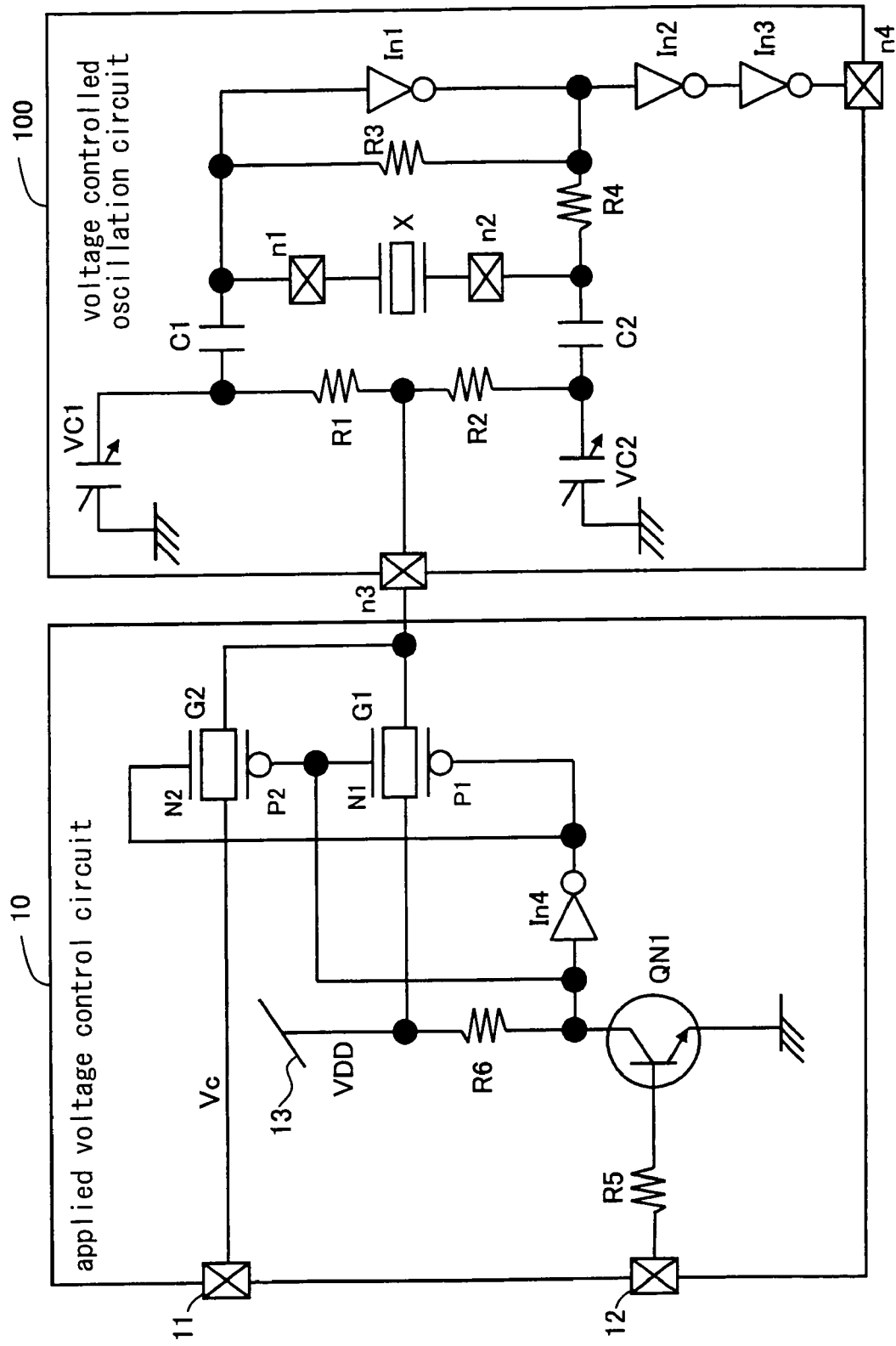
FIG. 1 is a circuit diagram illustrating configurations of an applied voltage control circuit for a voltage controlled oscillation circuit and the voltage controlled oscillation circuit according to a first preferred embodiment of the present invention.

Hereinafter, preferred embodiments of the present invention are described referring to the drawings.

First Preferred Embodiment

FIG. 1 is a circuit diagram illustrating configurations of an applied voltage control circuit 10 for a voltage controlled oscillation circuit and a voltage controlled oscillation circuit 100 according to a first preferred embodiment of the present invention.

Figure 10:
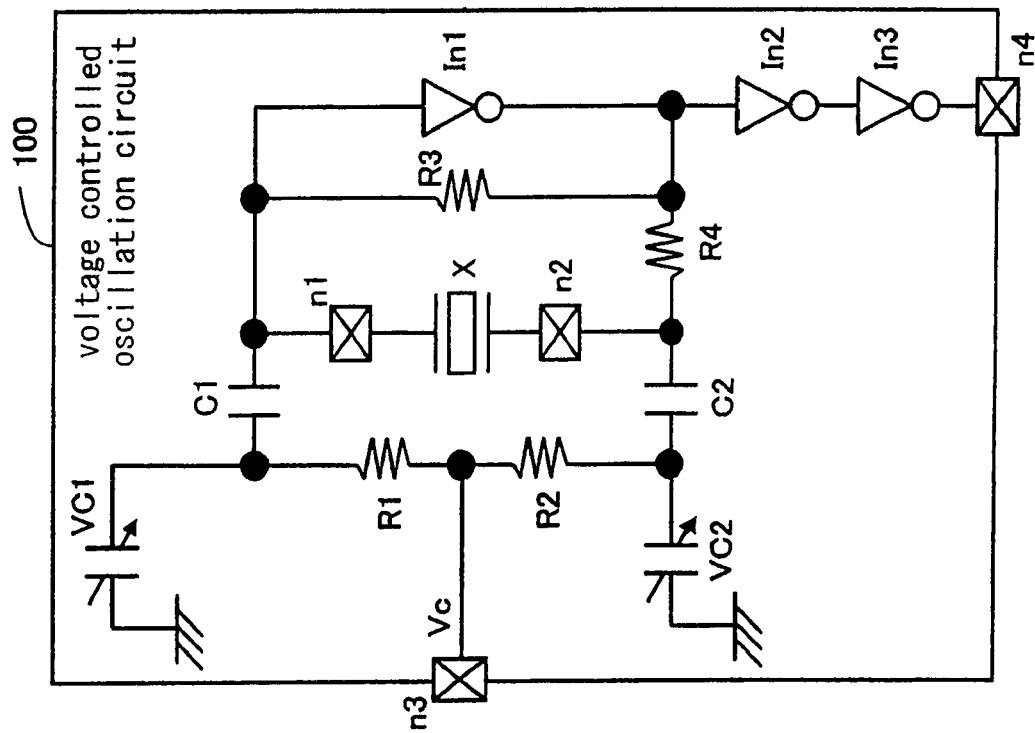
FIG. 10 is a circuit diagram illustrating a configuration of a voltage controlled oscillation circuit according to a conventional technology.
Figure 11:
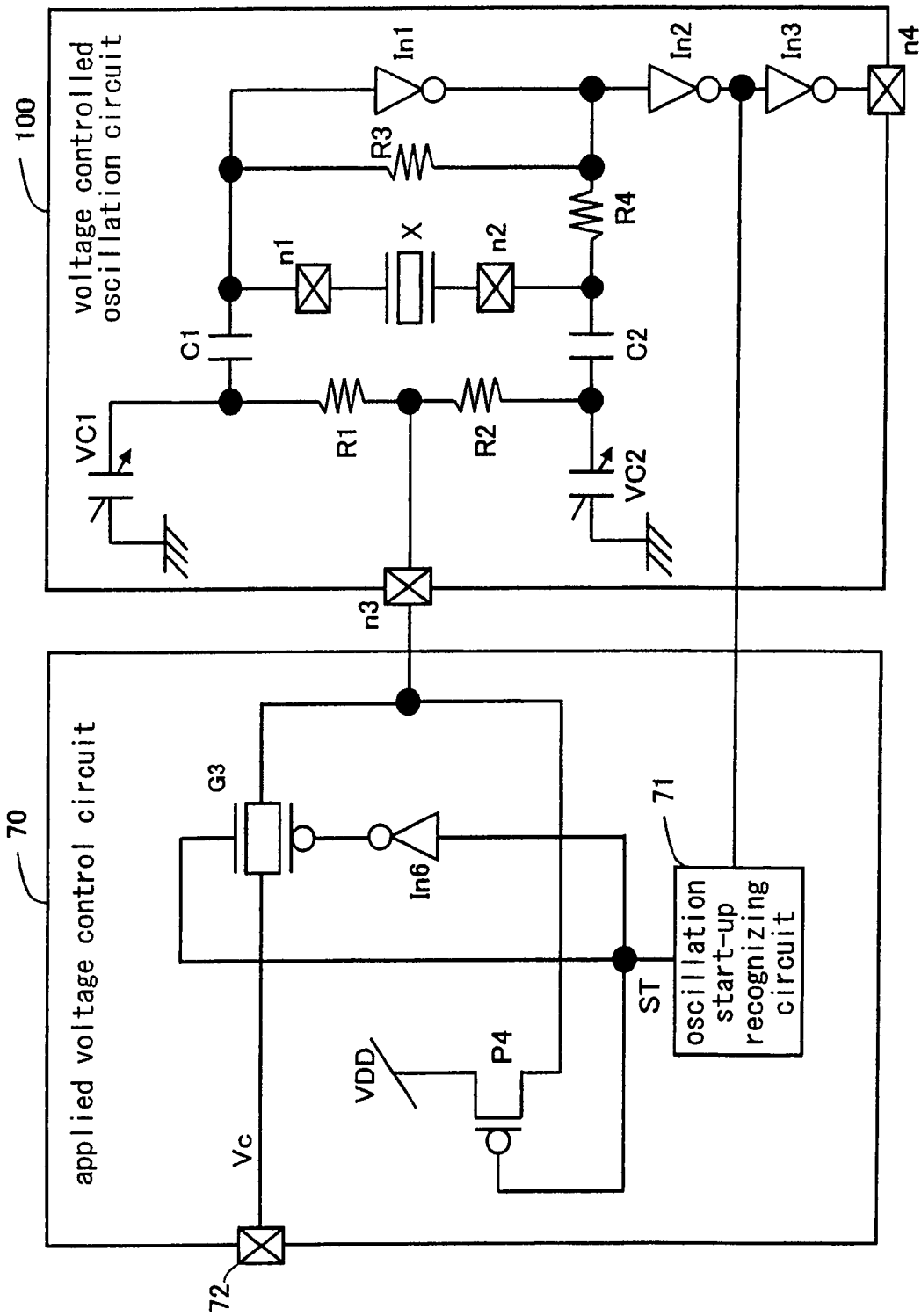
FIG. 11 is a circuit diagram illustrating configurations of an applied voltage control circuit for a voltage controlled oscillation circuit and the voltage controlled oscillation circuit according to a modified conventional technology.

The voltage controlled oscillation circuit 100, which is configured in a manner similar to that of the conventional technology shown in FIG. 10, is not described below again.

The applied voltage control circuit 10 comprises, as main components thereof, a first transmission gate G1, a second transmission gate G2, and an NPN transistor QN1 for switching an applied voltage. The first transmission gate G1 determines application/disconnection of a power-supply voltage VDD with respect to a control input terminal n3 of the voltage controlled oscillation circuit 100. The second transmission gate G2 determines application/disconnection of a voltage level Vc of a control signal from a voltage control terminal 11 with respect to the control input terminal n3 of the voltage controlled oscillation circuit 100. The NPN transistor QN1 contrarily switches to and from conduction/disconnection of the first transmission gate G1 and conduction/disconnection of the second transmission gate G2 by controlling the applied voltage with respect to a general purpose terminal 12. The power-supply voltage VDD maintains a voltage level enough for oscillation of a quartz resonator X in the voltage controlled oscillation circuit 100 to be successfully stabilized.

The first transmission gate G1 is interposed in a connection line of a power-supply voltage terminal 13 to which the power-supply voltage VDD is applied and the control input terminal n3 of the voltage controlled oscillation circuit 100. The second transmission gate G2 is interposed in a connection line of the voltage control terminal 11 and the control input terminal n3.

A collector of the NPN transistor QN1 is connected to the terminal 13 to which the power-supply voltage VDD is applied via a resistance R6, an emitter thereof is grounded, and a base thereof is connected to the general purpose terminal 12 via a resistance R5. The collector of the NPN transistor QN1 is connected to a gate of an NMOS transistor N1 of the first transmission gate G1 and a gate of a PMOS transistor P2 of the second transmission gate G2. The collector of the NPN transistor QN1 is further connected to a gate of a PMOS transistor P1 of the first transmission gate G1 and a gate of an NMOS transistor N2 of the second transmission gate G2 via an inverter In4.

Next, an operation of the applied voltage control circuit 10 is described.

Just after starting the power supply, a voltage at "L" level is applied to the general purpose terminal 12 by a control signal from a general purpose port of an external microcomputer or LSI. Thereby, the NPN transistor QN1 remains disconnected, the collector of the NPN transistor QN1 is at "H" level by the power-supply voltage VDD, and an output level of an inverter In4 is at the "L" level. Accordingly, the NMOS transistor N1 is conducted since the "L" level is applied to the gate thereof, and the PMOS transistor P1 is also conducted since the "L" level is applied to the gate thereof. Thereby, the first transmission gate G1 is in the conducted state. The NMOS transistor N2 is disconnected since the "L" level is applied to the gate thereof, and the PMOS transistor P2 is also disconnected since the "H" level is applied to the gate thereof. Thereby, the second transmission gate G2 remains disconnected. As a result, the power-supply voltage VDD is applied to the control input terminal n3 of the voltage controlled oscillation circuit 100 via the first transmission gate G1. The power-supply voltage VDD is sufficiently higher than the voltage level Vc of the control signal applied to the voltage control terminal 11. The sufficiently high power-supply voltage VDD is applied to varicaps VC1 and VC2 of the voltage controlled oscillation circuit 100. Therefore, a length of time for starting the oscillation can be reduced immediately after the power supply is turned on, and the quartz resonator can be stably oscillated.

When the power supply is turned so as to start the oscillation and the oscillation is stabilized, the external microcomputer or LSI inverts a polarity of the general purpose control port, so that the state of the general purpose terminal 12 shifts from the "L" level to the "H" level. The "H" level at the time may be any voltage at least a minimum voltage 0.6 (V) for conducting the NPN transistor QN1. The NPN transistor QN1 is conducted, and the collector thereof is at the "L" level. Therefore, the first transmission gate G1 is disconnected, and the second transmission gate G2 is conducted. Thereby, the control operation shifts to the conventional control through the voltage control terminal 11.

When the voltage level "H" of the control signal outputted from the general purpose control port of the external microcomputer or LSI is at least the minimum voltage 0.6 (V) for conducting the NPN transistor QN1, the power-supply voltage VDD having a higher voltage level can be applied to the gates of the first and second transmission gates G1 and G2 through the operation of the NPN transistor QN1 after the oscillation of the quartz resonator X is stabilized. As a result, the operations of the first and second transmission gates G1 and G2 can be inverted. Thus, the control signal from the general purpose port is effective even though the voltage level thereof falls below a minimum allowance value for recognizing the "H" level in the first and second transmission gates G1 and G2.

It becomes difficult to stably control the conduction/disconnection of the first and second transmission gates G1 and G2, if directly controlled by the control signal from the external microcomputer or LSI, due to a shortage in the voltage of the control signal from the general purpose port because the voltage level of the control signal from the general purpose port may not satisfy the minimum allowance value for recognizing the "H" level in the first and second transmission gates G1 and G2. So, the voltage level of the control signal from the general purpose control port of the external microcomputer or LSI is converted by the NPN transistor QN1. Thereby, the minimum allowable value to recognize the "H" level can be satisfied in the first and second transmission gates G1 and G2.

Second Preferred Embodiment

A second preferred embodiment of the present invention realizes an operation achieving a higher speed in comparison to the first preferred embodiment.

FIG. 2 is a circuit diagram illustrating configurations of an applied voltage control circuit 20 for a voltage controlled oscillation circuit and a voltage controlled oscillation circuit 100 according to the second preferred embodiment.

In the present embodiment, the inverter In4 according to the first preferred embodiment is omitted, and an NPN transistor QN2, a PNP transistor QP1 and an inverter In5 are additionally provided.

A base of the NPN transistor QN2 is connected to a collector of the NPN transistor QN1 via a resistance R7, an emitter thereof is grounded, and a collector thereof is connected to a base of the PNP transistor QP1 via a resistance R8. An emitter of the PNP transistor QP1 is connected to the power-supply voltage terminal 13 to which the power-supply voltage VDD is applied, and a collector thereof is connected to a source of the first transmission gate G1 via a resistance R9. A collector of the NPN transistor QN2 is connected to the gate of the PMOS transistor P1 of the first transmission gate G1 and the gate of the NMOS transistor N2 of the second transmission gate G2. The collector of the NPN transistor QN2 is further connected to the gate of the NMOS transistor N1 of the first transmission gate G1 and the gate of the PMOS transistor P2 of the second transmission gate G2 via the inverter In5. The rest of the configurations, which is similar to those in the first preferred embodiment, and is not described below again.

Next, an operation of the applied voltage control circuit 20 is described.

The voltage of "L" level is applied to the general purpose terminal 12 by the control signal from the general purpose control port of the external microcomputer or LSI just after starting the power supply. Thereby, the NPN transistor QN1 remains disconnected. The collector of the NPN transistor QN1 is at the "H" level by the power-supply voltage VDD, and the "H" level is applied to the base of the NPN transistor QN2. Then, the NPN transistor QN2 is conducted, and the collector of the NPN transistor QN2 is at the "L" level. As a result, the PNP transistor QP1 is conducted, and the power-supply voltage VDD is applied to the source of the first transmission gate G1. Further, the collector of the NPN transistor QN2 is at the "L" level, and the first transmission gate G1 is conducted, while the second transmission gate G2 remains disconnected.

As a result, the power-supply voltage VDD is applied to the control input terminal n3 of the voltage controlled oscillation circuit 100 via the PNP transistor QP1 and the first transmission gate G1. The power-supply voltage VDD is sufficiently higher than the voltage level Vc of the control signal applied to the voltage control terminal 11. The sufficiently high power-supply voltage VDD is applied to the varicaps VC1 and VC2 of the voltage controlled oscillation circuit 100.

Figure 3:
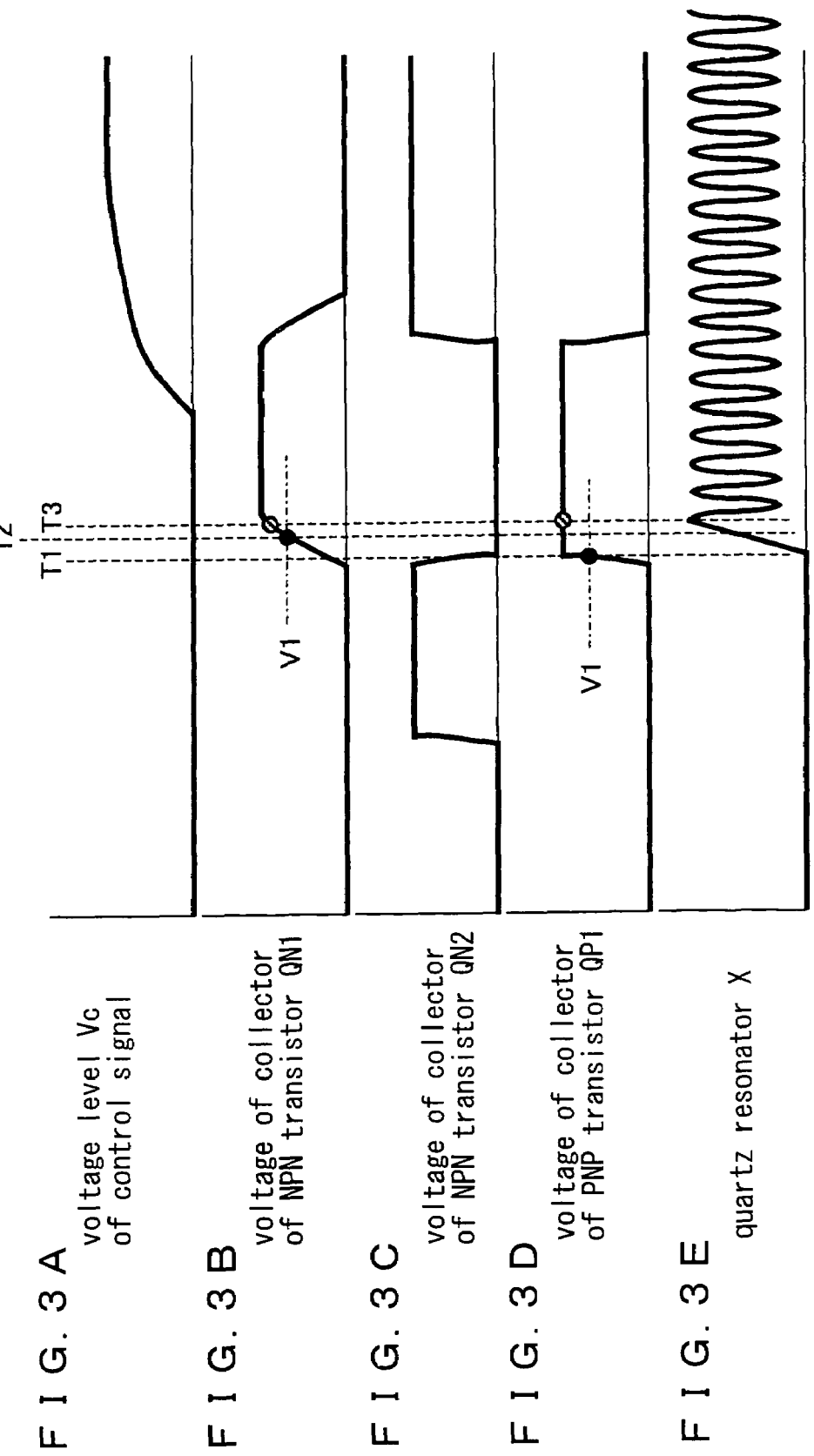
FIG. 3 is a timing chart of an operation of the applied voltage control circuit for the voltage controlled oscillation circuit according to the second preferred embodiment.

As shown in FIG. 3, in the applied voltage control circuit 10 according to the first preferred embodiment, a time length between a timing T2 when the first transmission gate G1 is conducted and a timing T3 when the oscillation of the quartz resonator X starts is very short, which fails to provide a sufficient amount of time.

In contrast to that, in the applied voltage control circuit 20 according to the second preferred embodiment, a timing T1 when the first transmission gate G1 is conducted is adequately earlier than the timing T2 according to the first preferred embodiment in consequence of providing the second NPN transistor QN2, PNP transistor QP1 and inverter In5. Therefore, there is a sufficient amount of time until the timing T3 when the oscillation of the quartz resonator X starts.

Thus, the power supply is turned on, and the oscillation is stabilized, and then, the external microcomputer or LSI is activated. Then, the external microcomputer or LSI reverses the polarity of the general purpose control port, and the state of the general purpose terminal 12 shifts from the "L" level to the "H" level. The "H" level at the time may be any voltage value at least the minimum voltage 0.6 (V) for conducting the NPN transistor QN1. The NPN transistor QN1 is conducted, and the collector thereof is at the "L" level. Therefore, the first transmission gate G1 is disconnected, and the second transmission gate G2 is conducted. Thereby, the control operation can shifts to the conventional control state in which the voltage level Vc of the control signal from the voltage control terminal 11 can be selected.

As a result, the switchover to the conventional control state can be realized from the initial stage of the start-up of the power supply at a higher speed than in the applied voltage control circuit 10 according to the first preferred embodiment. Therefore, the time length before the control from the external microcomputer or LSI starts can be reduced.

Third Preferred Embodiment

Figure 4:
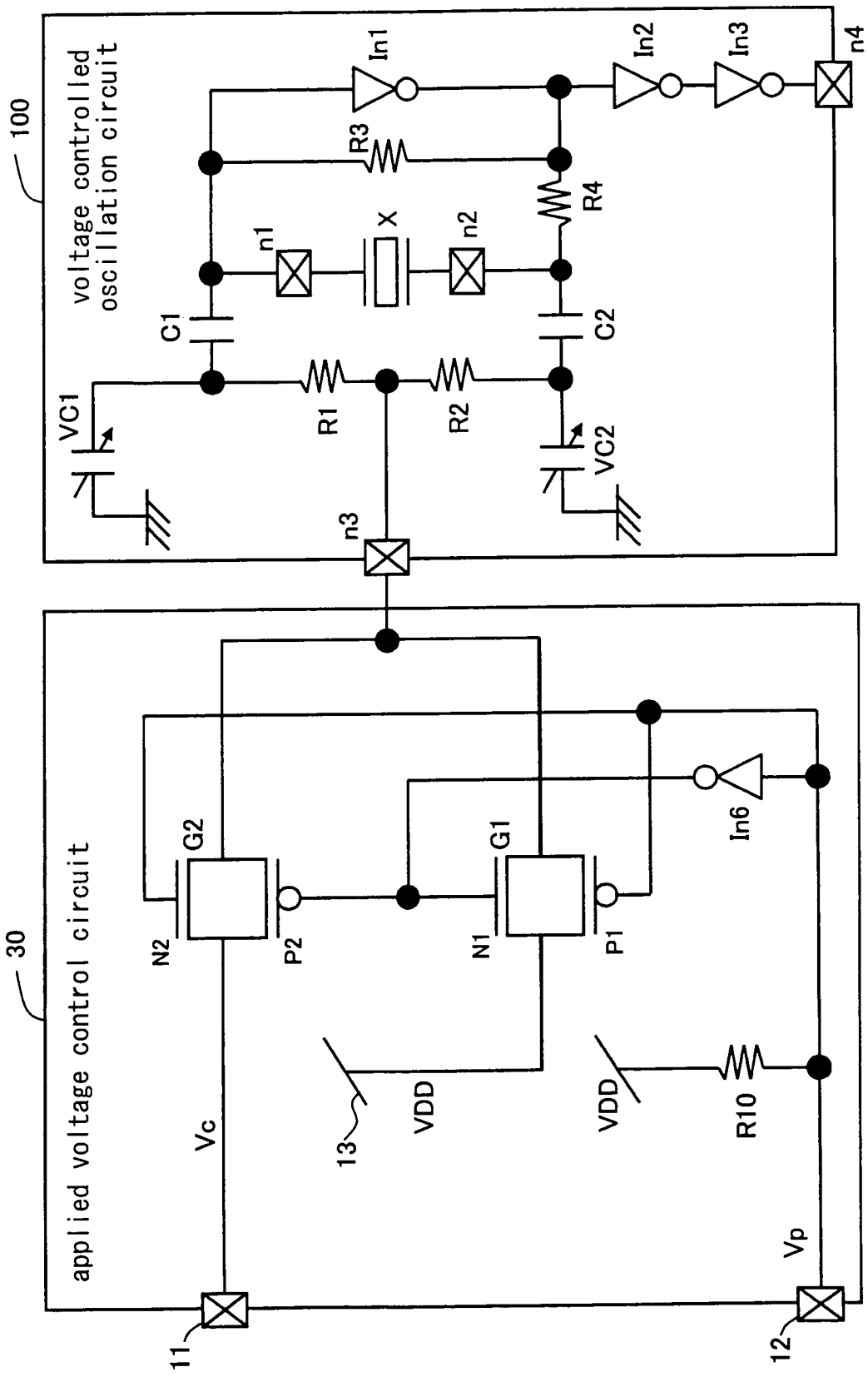
FIG. 4 is a circuit diagram illustrating configurations of an applied voltage control circuit for a voltage controlled oscillation circuit and the voltage controlled oscillation circuit according to a third preferred embodiment of the present invention.

FIG. 4 is a circuit diagram illustrating configurations of an applied voltage control circuit 30 for a voltage controlled oscillation circuit and a voltage controlled oscillation circuit 100 according to a third preferred embodiment of the present invention.

The first transmission gate G1 is inserted between the control input terminal n3 of the voltage controlled oscillation circuit 100 and the power-supply voltage terminal 13 to which the power-supply VDD is supplied. The second transmission gate G2 is inserted between the control input terminal n3 and the voltage control terminal 11 to which the voltage level Vc of the control signal is applied. The general purpose terminal 12 for external control is connected to the gate of the PMOS transistor P1 of the first transmission gate G1 and the gate of the NMOS transistor N2 of the second transmission gate G2. The general purpose terminal 12 is further connected to the gate of the NMOS transistor N1 of the first transmission gate G1 and the gate of the PMOS transistor P2 of the second transmission gate G2 via an inverter In6.

Further, a pull-up resistance R10 is connected to a switching line of the transmission gate connected to the general purpose terminal 12. The pull-up resistance R10 exerts a function as an integration circuit in the process where a voltage level Vp of the general purpose terminal 12 shifts from the "H" level to the "L" level to thereby mitigate a variation of a signal waveform.

Next, an operation of the applied voltage control circuit 30 comprising the pull-up resistance R10 is described.

It is assumed that the voltage level Vp of the general purpose terminal 12 is at the "L" level when the power supply is turned on. At the time, the PMOS transistor P1 is in the conducted state in the first transmission gate G1, and the NMOS transistor N1 is also in the conducted state. In consequence of that, the first transmission gate G1 is in the conducted state. The NMOS transistor N2 is in the disconnected state in the second transmission gate G2, and the PMOS transistor P2 is also in the disconnected state. In consequence of that, the second transmission gate G2 is in the disconnected state. As a result, the power-supply voltage VDD is applied to the control input terminal n3 of the voltage controlled oscillation circuit 100 via the first transmission gate G1. The power-supply voltage VDD is sufficiently higher than the voltage level Vc of the control signal applied to the voltage control terminal 11. The sufficiently high power-supply voltage VDD is applied to the varicaps VC1 and VC2 of the voltage controlled oscillation circuit 100. Therefore, the time length required for starting the oscillation can be reduced immediately after the power supply is turned on, and the quartz resonator X can be stably oscillated.

Figure 5:
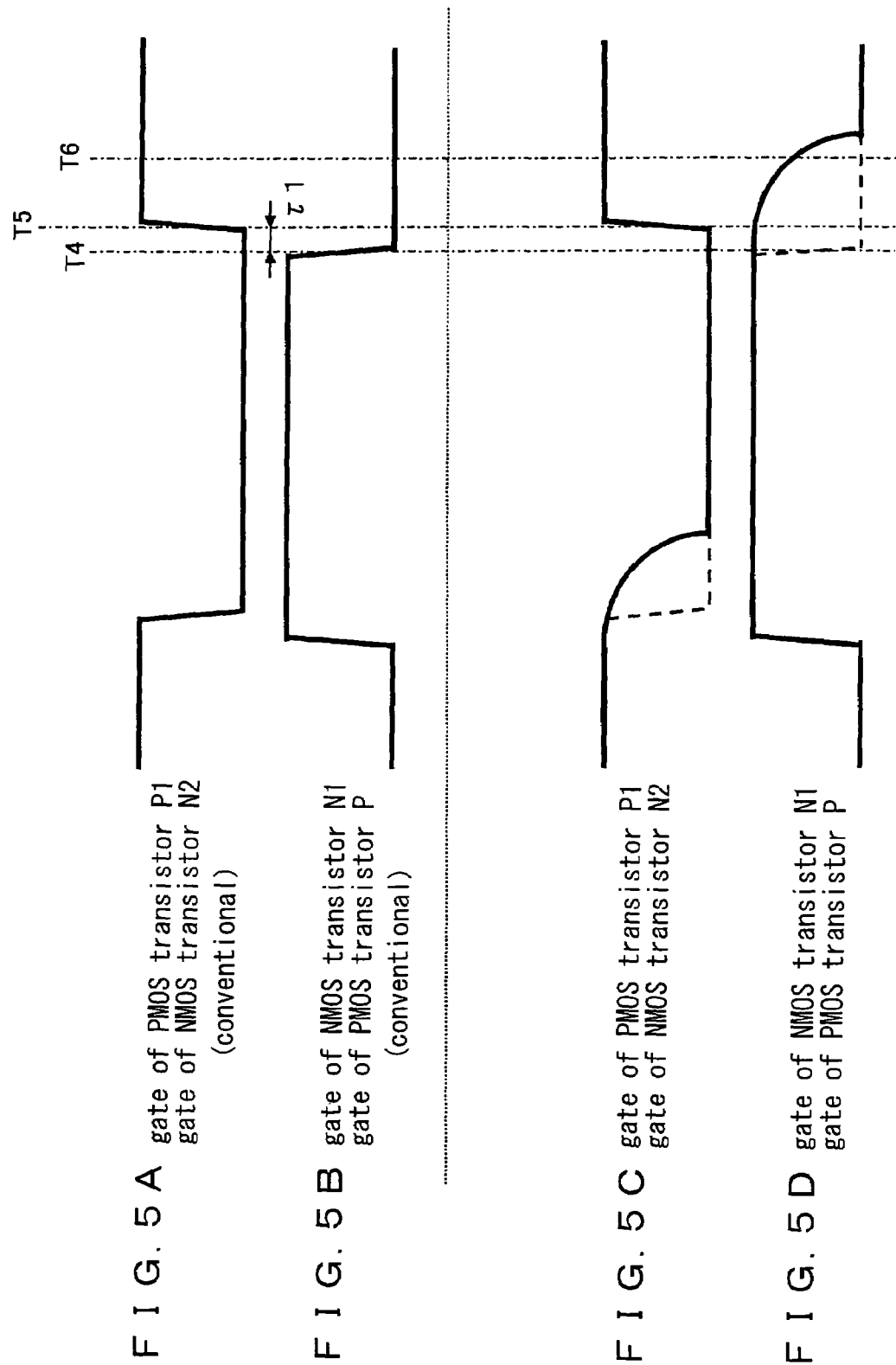
FIG. 5 is a timing chart of an operation of the applied voltage control circuit for the voltage controlled oscillation circuit according to the third preferred embodiment.

An effect obtained by the pull-up resistance R10 is described referring to FIG. 5. FIGS. 5A and 5B show an operation when the pull-up resistance R10 is not connected. FIGS. 5C and 5D show an operation according to the third preferred embodiment wherein the pull-up resistance R10 is connected.

In the case of the operation shown in FIGS. 5A and 5B wherein the pull-up resistance R10 is not connected, the voltage of the general purpose terminal 12 for external control is at the "L" level before a timing T4, and the first transmission gate G1 is in the conducted state, while the second transmission gate G2 is in the disconnected state. At the time, the power-supply voltage VDD from the power-supply voltage terminal 13 is applied to the control input terminal n3 of the voltage controlled oscillation circuit 100.

The quartz resonator X of the voltage controlled oscillation circuit 100 is stably oscillated, and the voltage of the general purpose terminal 12 is changed from the "L" level to the "H" level at the timing T4. At the timing T4, the NMOS transistor N1 of the first transmission gate G1 is disconnected, while the PMOS transistor P2 of the second transmission gate G2 is conducted.

At a timing T5 after a delay time τ1 has passed, the PMOS transistor P1 of the first transmission gate G1 is disconnected, while the NMOS transistor N2 of the second transmission gate G2 is conducted.

Observing the state of the first transmission gate G1 and the state of the second transmission gate G2 during the period from the timing T4 to the timing T5, the PMOS transistor P2 of the second transmission gate G2 switches to the conducted state while the PMOS transistor P1 of the first transmission gate G1 remains conducted due to the delay time τ1. Therefore, the first and second transmission gates G1 and G2 are simultaneously in the conducted state. As disadvantages generated therefrom, the power-supply voltage VDD from the power-supply voltage terminal 13 may be applied to the voltage control terminal 11 via the first and second transmission gates G1 and G2 in the conducted state, and a control port of the external microcomputer or LSI may be subjected to an overload.

In contrast to that, the operation according to the third preferred embodiment wherein the pull-up resistance R10 is provided is as shown in FIGS. 5C and 5D.

The quartz resonator X of the voltage controlled oscillation circuit 100 is stably oscillated, and the voltage of the general purpose terminal 12 is changed from the "L" level to the "H" level at the timing T4. At the time, the gate voltages of the NMOS transistor N1 of the first transmission gate G1 and the PMOS transistor P2 of the second transmission gate G2 very slowly change from the "H" level to the "L" level since the pull-up resistance R10 serves to mitigate the voltage variation. Therefore, at the timing T4, the NMOS transistor N1 still remains conducted, and the PMOS transistor P2 still remains disconnected. It is vitally important that the PMOS transistor P2 remains disconnected. There is no influence from the continued conducted state of the NMOS transistor N1 as is clear from the following description. As described, the first transmission gate G1 is continuously conducted, and the second transmission gate G2 is continuously disconnected.

At a timing T6 after a predetermined length of time has further passed since the timing T5 after the delay time τ1 passed, the NMOS transistor N1 of the first transmission gate G1 is disconnected, and the PMOS transistor P2 of the second transmission gate G2 is conducted.

Thus, the state where the first transmission gate G1 and the second transmission gate G2 are simultaneously conducted can be avoided in a transition state at switching the applied voltage. A resistance value of the pull-up resistance R10 is set to have a time constant that is optimal for avoiding the simultaneous conduction.

According to the third preferred embodiment, the period when the first and second transmission gates G1 and G2 are simultaneously conducted can be voided, and any overload can avoid to be applied to a control port of the external microcomputer or LSI.

Fourth Preferred Embodiment

Figure 6:
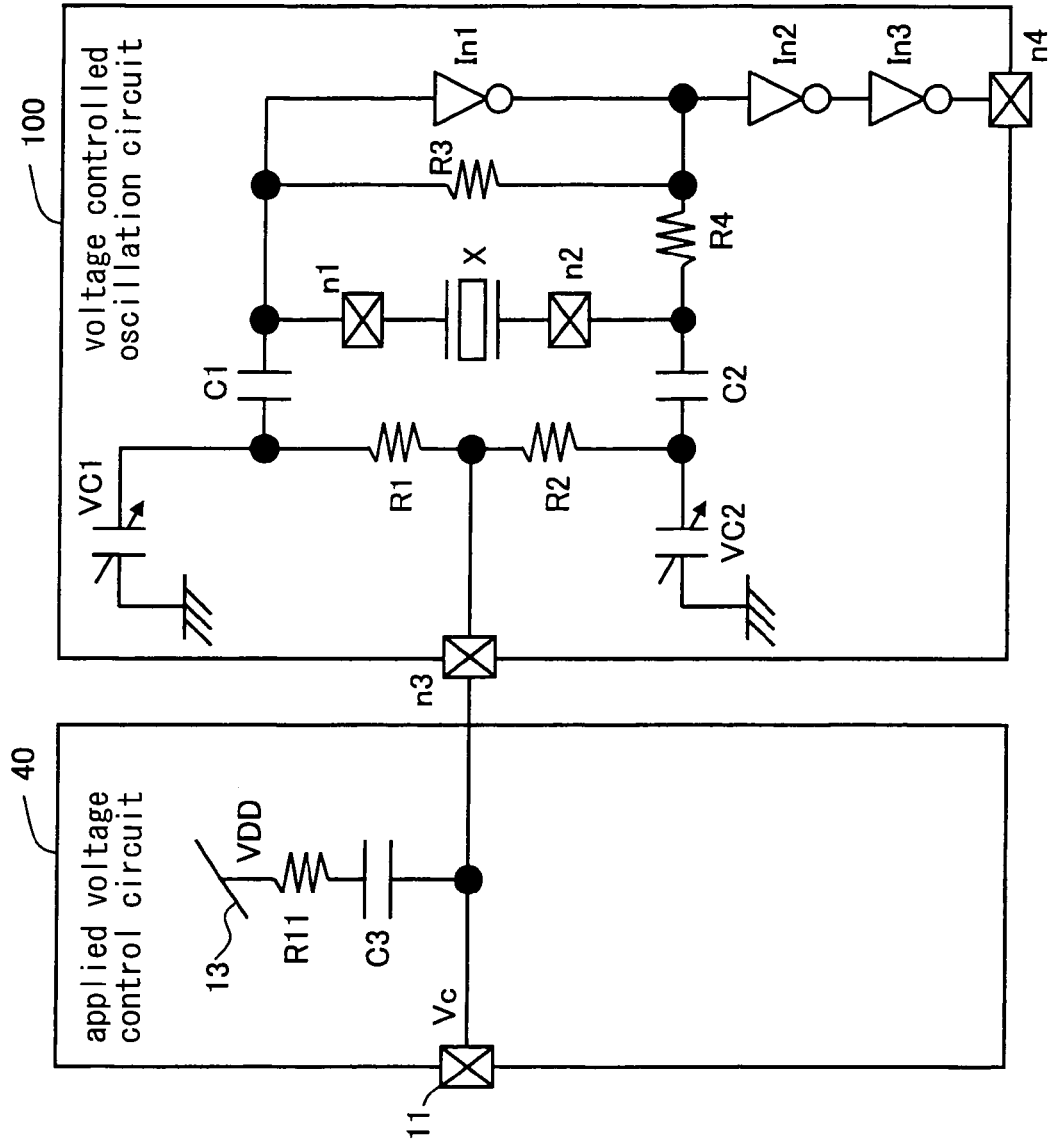
FIG. 6 is a circuit diagram illustrating configurations of an applied voltage control circuit for a voltage controlled oscillation circuit and the voltage controlled oscillation circuit according to a fourth preferred embodiment of the present invention.

FIG. 6 is a circuit diagram illustrating configurations of an applied voltage control circuit 40 for a voltage controlled oscillation circuit and a voltage controlled oscillation circuit 100 according to a fourth preferred embodiment of the present invention.

In the present preferred embodiment, a resistance R11 and a capacitor C3, which are serially connected to the power-supply voltage terminal 13 supplied with the power-supply voltage VDD, are connected to a connection line of the voltage control terminal 11 and the control input terminal n3 of the voltage controlled oscillation circuit 100.

Figure 7:
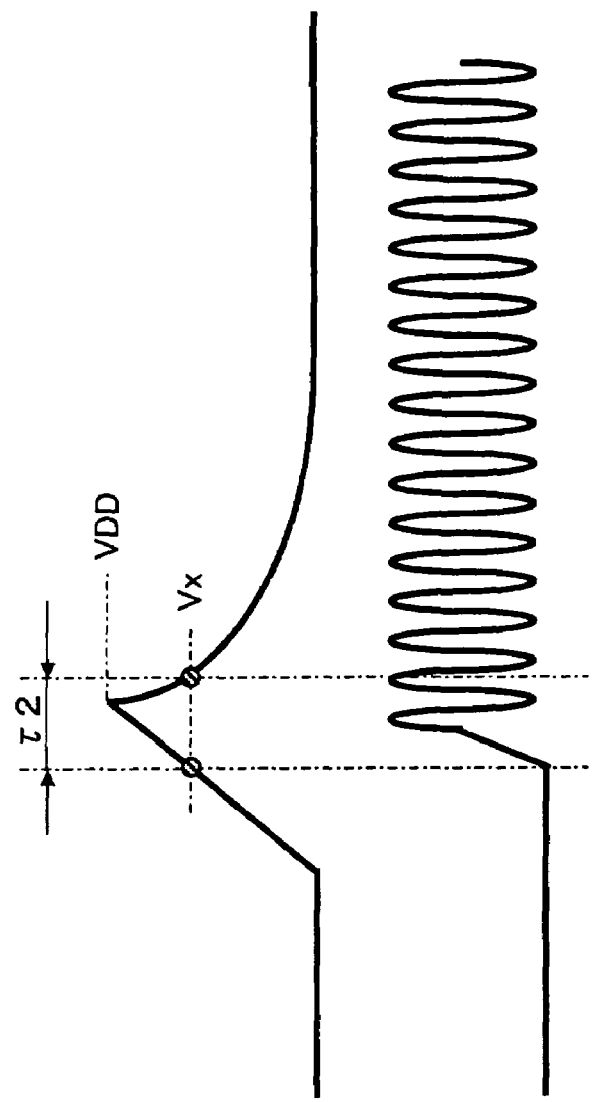
FIG. 7 is a timing chart of an operation of the applied voltage control circuit for the voltage controlled oscillation circuit according to the fourth preferred embodiment.

FIG. 7 is a timing chart of an operation according to the fourth preferred embodiment. When the power supply is turned on, the capacitor C3 is charged with the voltage level Vc of the control signal applied to the voltage control terminal 11. The capacitor C3 is fully charged when the voltage thereof increases to the power-supply voltage VDD, and starts to discharge at the same time. In conjunction with the discharge, the voltage controlled oscillation circuit 100 starts the oscillation. A capacitance of the capacitor C3 is selectively set to such a capacitance value that starts the oscillation of the quartz resonator X within a period τ2, during which a voltage higher than a voltage Vx satisfying an oscillation margin can be supplied.

Fifth Preferred Embodiment

Figure 8:
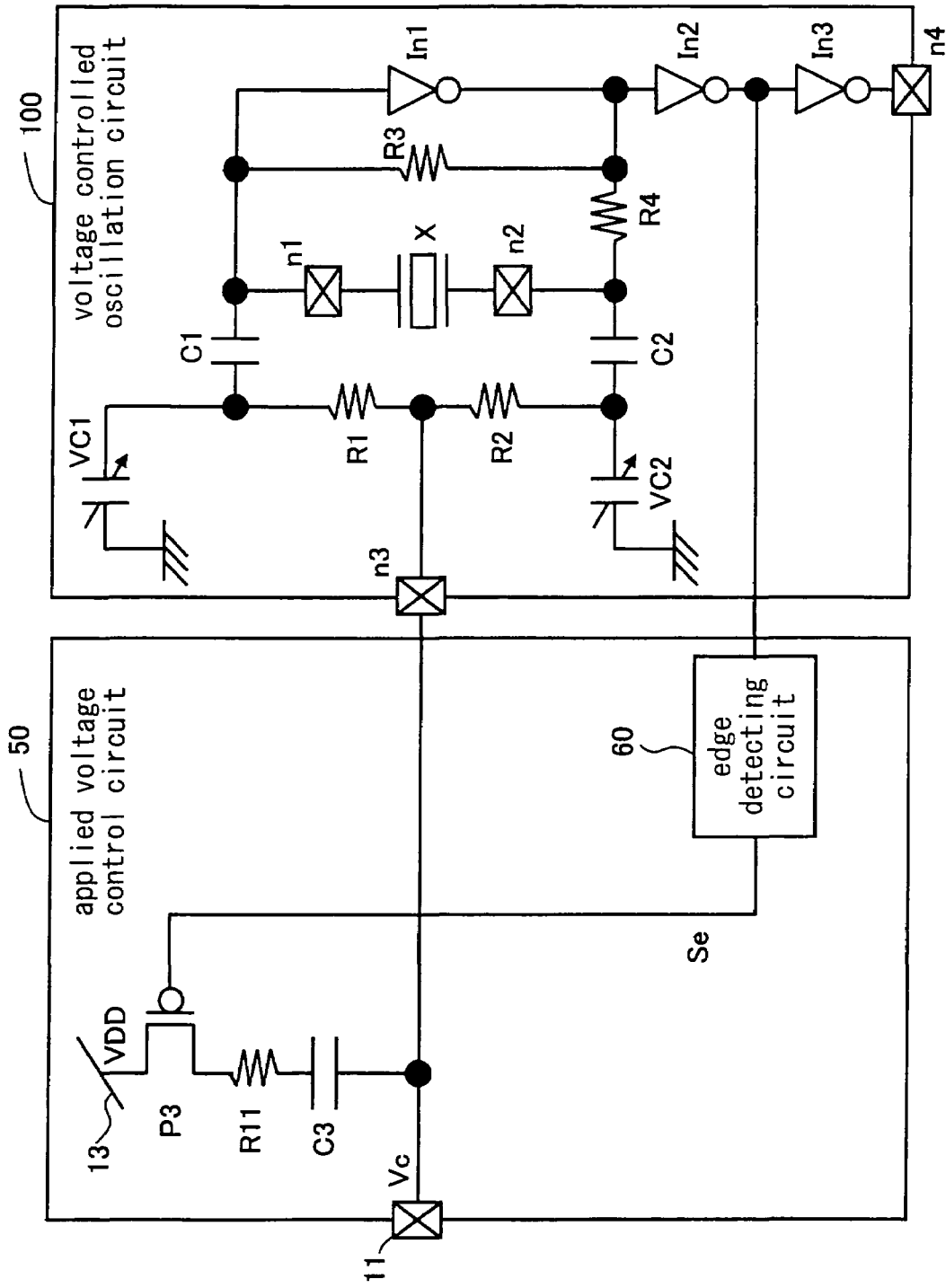
FIG. 8 is a circuit diagram illustrating configurations of an applied voltage control circuit for a voltage controlled oscillation circuit and the voltage controlled oscillation circuit according to a fifth preferred embodiment of the present invention.

FIG. 8 is a circuit diagram illustrating configurations of an applied voltage control circuit 50 for a voltage controlled oscillation circuit and a voltage controlled oscillation circuit 100 according to a fifth preferred embodiment of the present invention.

The applied voltage control circuit 50 according to the fifth preferred embodiment is characterized in that a PMOS transistor P3 is inserted between the resistance R11 and the power-supply voltage terminal 13 in the applied voltage control circuit 40 show in FIG. 4. Further, a gate of the PMOS transistor P3 is controlled by an edge detecting signal Se outputted from an edge detecting circuit 60 connected to a connection line of an inverter In2 and an inverter In3 in the voltage controlled oscillation circuit 100. The edge detecting circuit 60 detects a rising waveform or a falling waveform in a clock waveform after the oscillation of the quartz resonator X. The edge detecting circuit 60 outputs the "L" level before the detection and outputs "H" level after the detection as the edge detecting signal Se.

Next, an operation of the applied voltage control circuit 50 is described.

Figure 9:
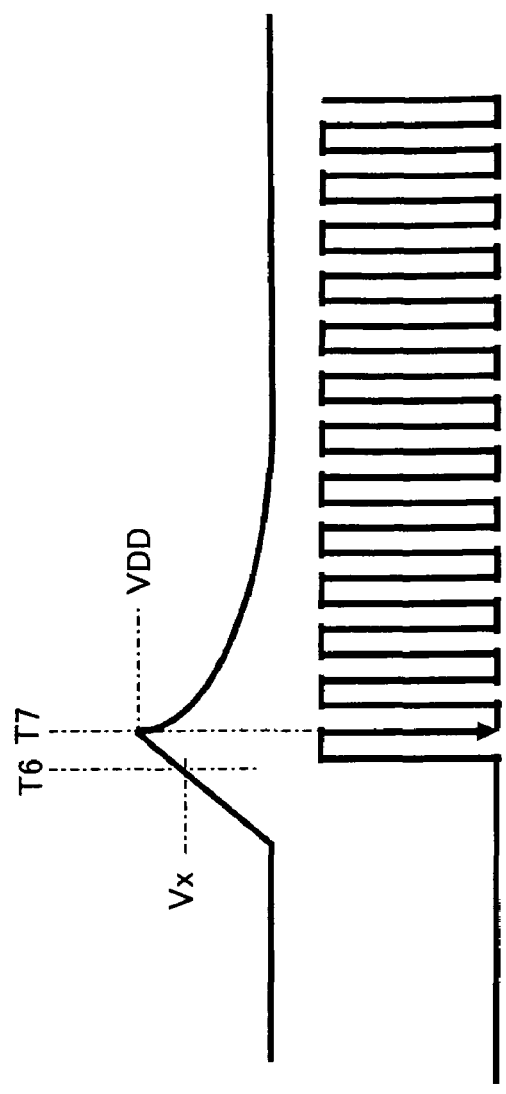
FIG. 9 is a timing chart of an operation of the applied voltage control circuit for the voltage controlled oscillation circuit according to the fifth preferred embodiment.

Immediately after the power supply is turned on and until the falling waveform or the rising waveform in the clock waveform after the oscillation of the quartz resonator X in the voltage controlled oscillation circuit 100 is detected, the edge detecting circuit 60 detects the "L" level as the edge detecting signal Se. In other words, the PMOS transistor P3 is conducted. Thereby, as shown in FIG. 9, the voltage level Vc of the control signal applied to the voltage control terminal 11 increases to the power-supply voltage VDD since the capacitor C3 is charged. Even though the voltage level Vc of the control signal does not reach the power-supply voltage VDD, the oscillation of the quartz resonator X starts. Then, the edge detecting signal Se outputted from the edge detecting circuit 60 changes from the "L" level to the "H" level when the edge detecting circuit 60 detects the falling waveform or the rising waveform in the oscillation clock, and the PMOS transistor P3 is thereby disconnected. As a result, the capacitor C3 starts to discharge, and the voltage level Vc of the control signal gradually reduces. The control operation of the applied voltage control circuit 50 is not affected by the voltage control terminal 11 because the PMOS transistor P3 is disconnected.

According to the fifth preferred embodiment, the control operation shifts to the control through the voltage control terminal 11 immediately after the oscillation of the quartz resonator X is stabilized. Therefore, the time length required to start the oscillation can be reduced in comparison to the applied voltage control circuit 40 according to the fourth preferred embodiment. The capacitance of the capacitor is selected so that a timing T6 when the voltage level Vc of the control signal reaches the voltage level Vx to satisfy the oscillation margin is earlier than a timing T7 when the falling or the rising waveform of the clock is detected after the oscillation of the quartz resonator X starts. This depends on a slewing rate of voltage increase based on a difference in the capacitance of the capacitor. The voltage level Vc of the control signal at the timing T7 is a voltage value at least the voltage level Vx.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. An applied voltage control circuit for a voltage controlled oscillation circuit comprising:

a first transmission gate inserted between a control input terminal of the voltage controlled oscillation circuit and a power-supply terminal;

a second transmission gate inserted between the control input terminal of the voltage controlled oscillation circuit and a voltage control terminal; and an NPN transistor for switching an applied voltage inserted between a connection point of the power-supply terminal and the first transmission gate, and a ground terminal, and controlled by a control signal applied to a general purpose terminal externally controlled, wherein a collector of the NPN transistor is connected to a gate of an NMOS transistor of the first transmission gate and a gate of a PMOS transistor of the second transmission gate, and further connected to a gate of a PMOS transistor of the first transmission gate and a gate of an NMOS transistor of the second transmission gate via an inverter, the NPN transistor is disconnected when a power supply is turned on so that the first transmission gate is conducted and the second transmission gate is disconnected, and a power-supply voltage of the power-supply terminal is applied to the control input terminal of the voltage controlled oscillation circuit via the first transmission gate in the conducted state, and the NPN transistor is switched to the conducted state by the control signal applied to the general purpose terminal after oscillation of the voltage controlled oscillation circuit is stabilized so that the first transmission gate is switched to the disconnected state and the second transmission gate is switched to the conducted state, and a voltage of the voltage control terminal is applied to the control input terminal of the voltage controlled oscillation circuit via the second transmission gate in the conducted state.

2. An applied voltage control circuit for a voltage controlled oscillation circuit comprising:

a first transmission gate whose one end is connected to a control input terminal of the voltage controlled oscillation circuit;

a PNP transistor inserted between another end of the first transmission gate and a power-supply terminal;

a second transmission gate inserted between the control input terminal of the voltage controlled oscillation circuit and a voltage control terminal;

a first NPN transistor inserted between a ground terminal and a connection point of the power-supply terminal and the PNP transistor and controlled by a control signal applied to a general purpose terminal externally controlled; and a second NPN transistor whose base is connected to a collector of the first NPN transistor, collector is connected to a base of the PNP transistor, and emitter is grounded, wherein the collector of the second NPN transistor is connected to a gate of a PMOS transistor of the first transmission gate and a gate of an NMOS transistor of the second transmission gate, and further connected to a gate of an NMOS transistor of the first transmission gate and a gate of a PMOS transistor of the second transmission gate via an inverter, the first NPN transistor is disconnected, the second NPN transistor is conducted, and the PNP transistor is conducted when a power supply is turned on so that the first transmission gate is conducted and the second transmission gate is disconnected, and a power-supply voltage of the power-supply terminal is applied to the control input terminal of the voltage controlled oscillation circuit via the PNP transistor and the first transmission gate in the conducted state, and the first NPN transistor is switched to the conducted state by the control signal applied to the general purpose terminal after oscillation of the voltage controlled oscillation circuit is stabilized so that the first transmission gate is switched to the disconnected state and the second transmission gate is switched to the conducted state, and a voltage of the voltage control terminal is applied to the control input terminal of the voltage controlled oscillation circuit via the second transmission gate in the conducted state.

3. An applied voltage control circuit for a voltage controlled oscillation circuit comprising:

a first transmission gate inserted between a control input terminal of the voltage controlled oscillation circuit and a power-supply terminal;

a second transmission gate inserted between the control input terminal of the voltage controlled oscillation circuit and a voltage control terminal; and a pull-up resistance connected to a connection line of a general purpose terminal externally controlled and the control input terminal of the voltage controlled oscillation circuit, wherein the general purpose terminal externally controlled is connected to a gate of a PMOS transistor of the first transmission gate and a gate of an NMOS transistor of the second transmission gate, and further connected to a gate of an NMOS transistor of the first transmission gate and a gate of a PMOS transistor of the second transmission gate via an inverter, "L" level is applied to the general purpose terminal when a power supply is turned on so that the first transmission gate is conducted and the second transmission gate is disconnected, and a power-supply voltage of the power-supply terminal is applied to the control input terminal of the voltage controlled oscillation circuit via the first transmission gate in the conducted state, and the control signal applied to the general purpose terminal is switched after oscillation of the voltage controlled oscillation circuit is stabilized so that the first transmission gate is switched to the disconnected state and the second transmission gate is switched to the conducted state, and a voltage of the voltage control terminal is applied to the control input terminal of the voltage controlled oscillation circuit via the second transmission gate in the conducted state.

4. The applied voltage control circuit for the voltage controlled oscillation circuit according to claim 1, wherein a conductivity type of the respective transistors is reversed, and a logic of the voltage for the control operation is reversed.

5. The applied voltage control circuit for the voltage controlled oscillation circuit according to claim 2, wherein a conductivity type of the respective transistors is reversed, and a logic of the voltage for the control operation is reversed.

6. The applied voltage control circuit for the voltage controlled oscillation circuit according to claim 3, wherein a conductivity type of the respective transistors is reversed, and a logic of the voltage for the control operation is reversed.

7. An applied voltage control circuit for a voltage controlled oscillation circuit used for controlling start-up of oscillation of the voltage controlled oscillation circuit, comprising:

a voltage control terminal to which a voltage is applied from outside;

a power-supply voltage terminal to which a power-supply voltage used for controlling the voltage controlled oscillation circuit is supplied during a certain period after the start-up of the voltage controlled oscillation circuit;

a first transmission gate for transmitting the power-supply voltage supplied via the power-supply voltage terminal to the voltage controlled oscillation circuit in order to control the voltage controlled oscillation circuit; and a second transmission gate for transmitting the voltage applied from the voltage control terminal to the voltage controlled oscillation circuit in order to control the voltage controlled oscillation circuit, wherein the first transmission gate is conducted by the power-supply voltage supplied via the power-supply voltage terminal during a certain period after the start-up of the voltage controlled oscillation circuit so that the power-supply voltage supplied via the power-supply voltage terminal is transmitted to the voltage controlled oscillation circuit in order to control the voltage controlled oscillation circuit, and the second transmission gate is conducted by the power-supply voltage supplied via the power-supply voltage terminal during a certain period after the start-up of the voltage controlled oscillation circuit so that the voltage supplied from the voltage control terminal is transmitted to the voltage controlled oscillation circuit in order to control the voltage controlled oscillation circuit.

8. The applied voltage control circuit for the voltage controlled oscillation circuit according to claim 7, wherein the power-supply voltage supplied from the power-supply voltage terminal is higher than the voltage applied from the voltage control terminal.

9. The applied voltage control circuit for the voltage controlled oscillation circuit according to claim 8, further comprising a general purpose terminal to which a signal indicating that a certain period has passed since the start-up of the voltage controlled oscillation circuit is inputted, wherein the first and second transmission gates are controlled in accordance with the signal inputted from the general purpose terminal.

\* \* \* \* \*